United States Patent
Chi et al.

(10) Patent No.: US 8,644,076 B2
(45) Date of Patent: Feb. 4, 2014

(54) PROGRAMMABLE MEMORY DEVICE AND MEMORY ACCESS METHOD

(75) Inventors: Shih Chang Chi, Hsinchu (TW); Hsiang Sheng Liu, Hsinchu (TW); Kuo Jui Sun, Hsinchu (TW); Yen Min Chang, Hsinchu (TW)

(73) Assignee: Pixart Imaging Inc., Hsin-Chu (TW)

( * ) Notice: Subject to any disclaimer, the term of this patent is extended or adjusted under 35 U.S.C. 154(b) by 0 days.

(21) Appl. No.: 13/398,294

(22) Filed: Feb. 16, 2012

(65) Prior Publication Data

US 2012/0206971 A1    Aug. 16, 2012

(30) Foreign Application Priority Data

Feb. 16, 2011    (TW) .............................. 100105048 A

(51) Int. Cl.
*G11C 11/34*    (2006.01)
(52) U.S. Cl.
USPC ................................ 365/185.18; 365/185.24
(58) Field of Classification Search
USPC ....................................... 365/185.18, 185.24
See application file for complete search history.

(56) References Cited

U.S. PATENT DOCUMENTS

| | | | |
|---|---|---|---|
| 6,728,137 B1 | 4/2004 | Lin | |
| 7,319,610 B2 * | 1/2008 | Kuo | 365/185.04 |
| 8,401,186 B2 * | 3/2013 | Liu | 380/46 |
| 2006/0285385 A1 * | 12/2006 | Kuo | 365/185.04 |
| 2008/0091901 A1 * | 4/2008 | Bennett et al. | 711/165 |
| 2009/0262565 A1 * | 10/2009 | Shin et al. | 365/94 |
| 2010/0177547 A1 * | 7/2010 | Shen | 365/94 |
| 2010/0220511 A1 * | 9/2010 | Kurjanowicz | 365/96 |

\* cited by examiner

*Primary Examiner* — Michael Tran
(74) *Attorney, Agent, or Firm* — Stites & Harbison PLLC; Juan Carlos A. Marquez, Esq.

(57) ABSTRACT

A programmable memory device includes a plurality of one-time programmable (OTP) memory units, a search unit, a writing unit, and a reading unit. Each OTP memory unit is assigned an address. The search unit searches for the first writable OTP memory unit from the plurality of OTP memory units in a writing operation, or searches for the last programmed OTP memory unit from the plurality of OTP memory units in a reading operation. The writing unit writes data to be written and the bit length of the data to the first writable OTP memory unit. The reading unit sequentially reads data from the last programmed OTP memory unit.

16 Claims, 7 Drawing Sheets

PROGRAMMABLE MEMORY DEVICE AND MEMORY ACCESS METHOD

CROSS-REFERENCE TO RELATED APPLICATION

The present application is based on, and claims priority from, Taiwan Patent Application Serial Number 100105048, filed on Feb. 16, 2011, the disclosure of which is hereby incorporated by reference herein in its entirety.

BACKGROUND

1. Technical Field

The present invention relates to a programmable memory device and an access method thereof, and relates more particularly to a programmable memory device comprising a plurality of one-time programmable memory units and an access method thereof.

2. Related Art

Due to the variations in process parameters among manufacturing equipment, manufactured integrated circuits may have, in varying degrees, process parameter variations between lots, wafers, and even chips on a wafer, and such variations may result in the component parameter variations of integrated circuit components such as resistors, capacitors, and transistors. As a result, circuits comprised of integrated circuit components, such as oscillators or voltage regulators, generate frequencies or output voltages that may deviate from their design values. If a parameter variation in the circuit of a chip is too large, exceeding the tolerance range in a specification, the chip will be determined defective. Thus, the semiconductor manufacturers usually need a fine-tuning procedure to reduce the variations of the circuits and improve manufacturing yields. Generally, the fine-tuning procedure applies a one-time programming (OTP) component, for example a fuse or a metal wire, to achieve a fine-tuning function.

A common adjusting method applying OTP means to ordinary integrated circuits comprises a laser trim method or a method (such as an E-fuse method) relying on a poly fuse structure. A laser trim method needs multiple OTP components, for example metal wires, to conduct programming. In the process of programming, a high-energy laser is used to blow different metal wires. Alternatively, the E-fuse method uses multiple OTP components, for example polysilicon wires or metal wires, for programming. In the process of programming, large current or voltage is applied to blow different polysilicon wires or metal wires. The above programming processes are irreversible and destructive operations, meaning the OTP components are unusable after the programming.

For repeatable programming, multiple-time programming (hereinafter referred to as MTP) components such as erasable programmable read only memories (EPROMs), electrically erasable programmable read only memories (EEPROMs), and flash memories are adopted. However, MTP components need additional circuits and complex manufacturing processes to build, resulting in high manufacturing cost. Further, MTP components need specific semiconductor manufacturing processes, consequently increasing the risk of failing to meet production targets.

Therefore, if OTP components have multiple-time programming capability, the manufacturing processes and cost can be reduced, and the OTP components can be configured multiple times. U.S. Pat. No. 6,728,137 discloses a programmable memory structure. Referring to FIG. 1, the programmable memory structure 10 is configured to use a plurality of memory blocks 15 to achieve a multiple-time programming function. The control circuit 11 writes data into and reads data from the programmable memory structure 10 through a row decoder 12 and a column decoder 13. During operation, the programmable memory structure 10 needs an additional record element 14 to record which memory block(s) 15 is (are) programmed.

In the conventional programmable memory structure 10, when new data is written, the data will be written into a new OTP memory block regardless of the quantity of the data. Even if only one bit of data is written, the conventional programmable memory structure 10 uses an entire OTP memory block to store the single bit of data. Consequently, when storing data, the conventional programmable memory structure 10 is prone to wasting storage space.

In summary, the industry urgently needs a programmable memory device comprising a plurality of one-time programmable memory units that does not have the above disadvantages.

SUMMARY

Embodiments of the present invention disclose a programmable memory device and an accessing method thereof. In an embodiment of the present invention, the programmable memory device includes a plurality of one-time programmable (OTP) memory units, a search unit, a writing unit, and a reading unit. Each OTP memory unit is assigned an address. The search unit searches for the first writable OTP memory unit from the plurality of OTP memory units in a writing operation, or searches for the last programmed OTP memory unit from the plurality of OTP memory units in a reading operation. The writing unit writes data to be written and the bit length of the data to the first writable OTP memory unit. The reading unit sequentially reads data from the last programmed OTP memory unit.

One embodiment of the present invention discloses a method of assessing a programmable memory device comprising a plurality of one-time programmable (OTP) memory units each assigned an address. The method comprises the steps of searching for a first writable OTP memory unit from a start address and performing, from the first writable OTP memory unit, writing steps that comprise writing a data bit length of the data to be written and writing the data to be written.

Another embodiment of the present invention discloses a method of reading a programmable memory device comprising a plurality of one-time programmable (OTP) memory units each assigned an address. The programmable memory device is configured to be written with data according to the above-embodied method. The method comprises the steps of searching for a last programmed OTP memory unit from a start address and sequentially reading data from the last programmed OTP memory unit.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF DISCLOSED EMBODIMENTS

Figure 1:
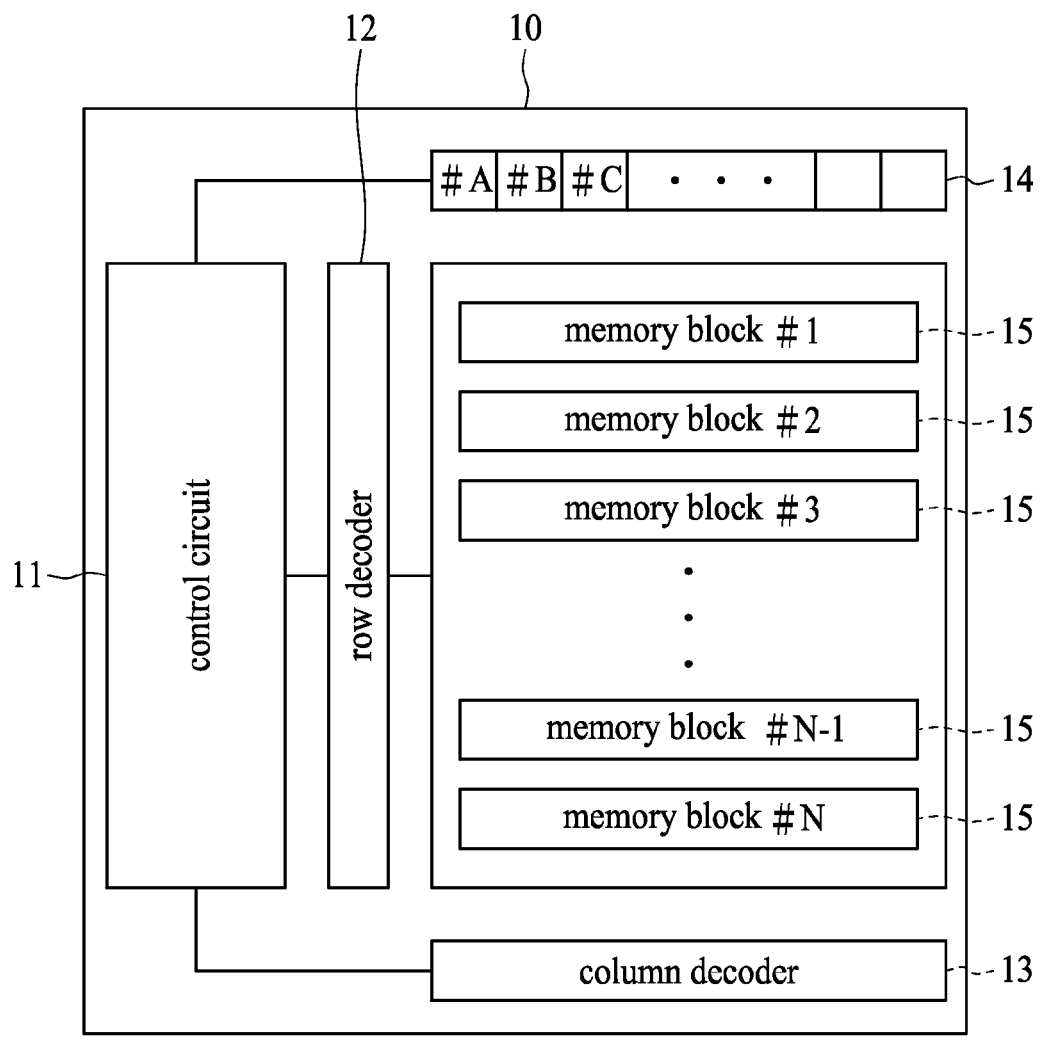
FIG. 1 is a block diagram showing a conventional programmable memory structure.

An embodied programmable memory device and the relevant reading and writing methods thereof are disclosed hereinafter. In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
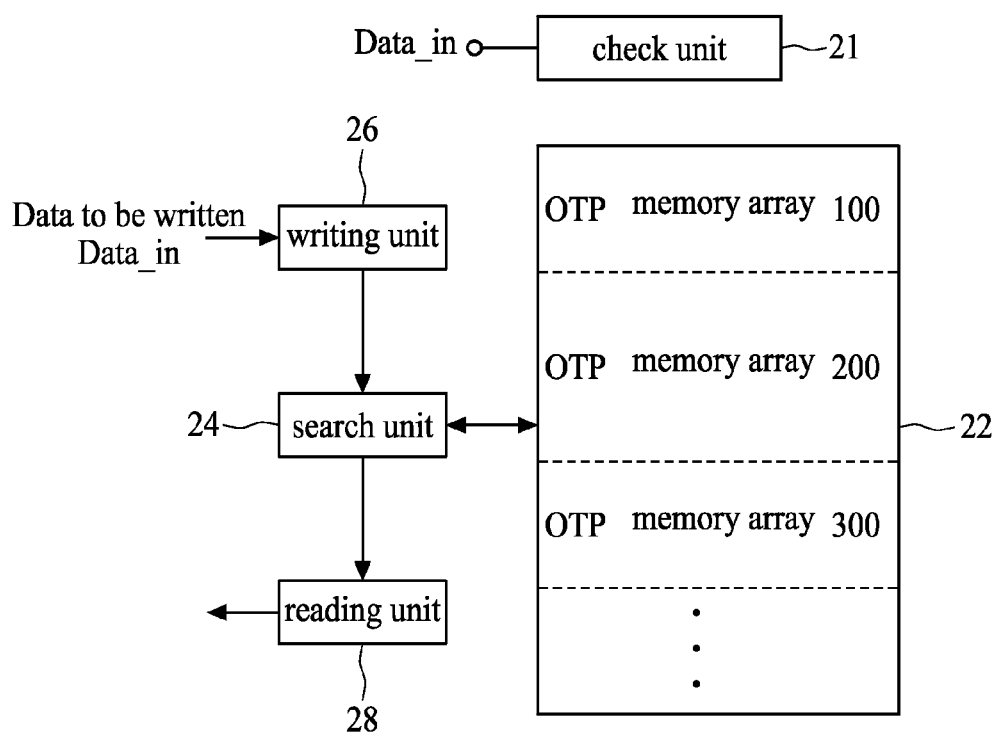
FIG. 2 is a block diagram showing a programmable memory device according to one embodiment of the present invention.

To facilitate the introduction of embodied programmable memory devices and the relevant reading and writing methods thereof, the details of a programmable memory device are introduced first. FIG. 2 is a block diagram showing a programmable memory device 20 according to one embodiment. The programmable memory device 20 comprises a plurality of one-time programmable (OTP) memory units (100, 200 and 300), a search unit 24, a writing unit 26, and a reading unit 28. The OTP memory units 100, 200 and 300 are located in a memory array 22. The search unit 24 is configured to search for, in the memory array 22, the first available or writable OTP memory unit (or a start OTP memory unit) immediately adjacent to the OTP memory unit last programmed in a writing operation, or to search for, in a reading operation, the last programmed OTP memory unit. The start OTP memory unit may be the OTP memory unit that does not store data and is immediately adjacent to the OTP memory unit(s) that has been written or stored data. The writing unit 26 is configured to write the data length of data to be written and the data itself to the memory array 22, starting from the first writable OTP memory unit immediately adjacent to the OTP memory unit last programmed. The reading unit 28 is configured to sequentially read data from the last programmed OTP memory unit.

Referring to FIG. 2, in one embodiment of the present invention, the programmable memory device 20 may further comprise a check unit 21 configured to check the remaining bits of the programmable memory device 20. The check unit 21 is configured to calculate the remaining bit length of the programmable memory device 20 and to compare the remaining bit length with the bit length of a data Data-in to be written. When the remaining bit length is greater than the bit length of the data Data-in to be written, a writing operation to the programmable memory device 20 is commenced.

Figure 3:
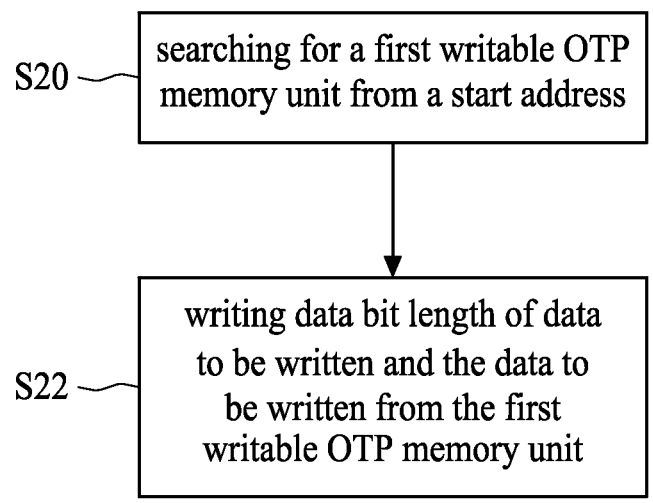
FIG. 3 is a flow diagram showing the steps of a method of assessing a programmable memory device according to one embodiment of the present invention.

FIG. 3 is a flow diagram showing the steps of a method of assessing a programmable memory device according to one embodiment of the present invention. The programmable memory device comprises a plurality of one-time programmable (OTP) memory units, and each OTP memory unit is assigned an address. The method comprises the steps of: searching for a first writable OTP memory unit or a start OTP memory unit immediately adjacent to the OTP memory unit, if any, last programmed from a start address (Step S20), and performing writing steps starting at the first writable OTP memory unit or the start OTP memory unit, wherein the writing steps comprise writing a data length of the data to be written and writing the data to be written (Step S22). The details of the method of assessing a programmable memory device are explained hereinafter.

Referring to FIG. 2, when writing to the programmable memory device 20, the search unit 24 initially searches for a start OTP memory unit or a first writable OTP memory unit immediately adjacent to the OTP memory unit last programmed for writing data. Because the OTP memory units 100, 200 and 300 included in the memory array 22 are one-time programmable elements, after one OTP memory unit is programmed, data cannot subsequently be written to the same OTP memory unit. Therefore, the programmable memory device 20 requires the search unit 24 to search the OTP memory units that are not programmed.

Figure 4:
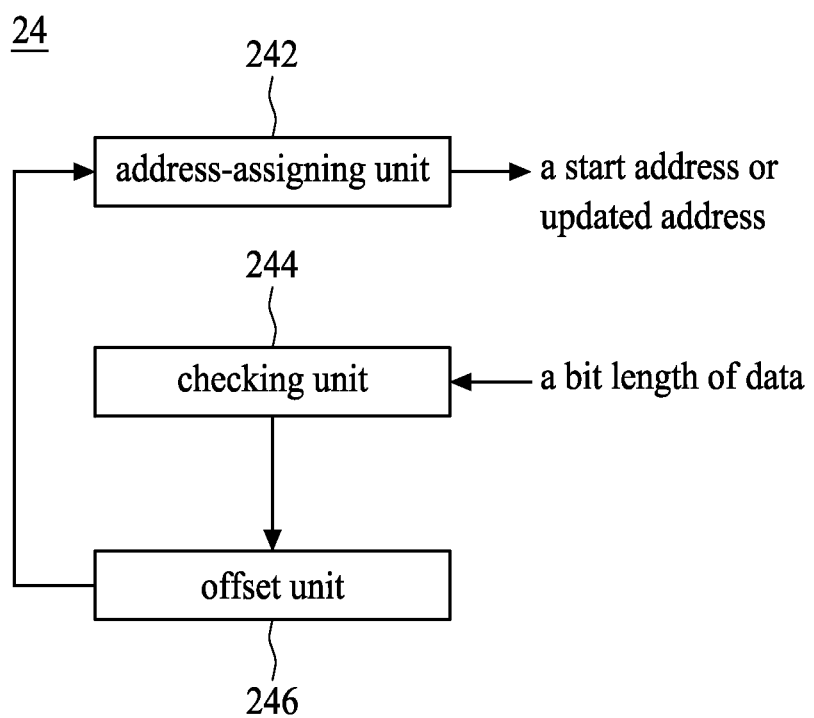
FIG. 4 is a block diagram showing a search unit according to one embodiment of the present invention.

FIG. 4 is a block diagram showing a search unit 24 according to one embodiment of the present invention. The search unit 24 comprises an address-assigning unit 242, a checking unit 244, and an offset unit 246. The address-assigning unit 242 is configured to provide a start address, or a new or updated address for the memory array 22. The checking unit 244 is configured to check the bit length of data written in the OTP memory unit corresponding to the start address or an updated address. The offset unit 246 is configured to provide the address-assigning unit 242 with an updated address according to the result of a checking operation by the checking unit 244.

Figure 5:
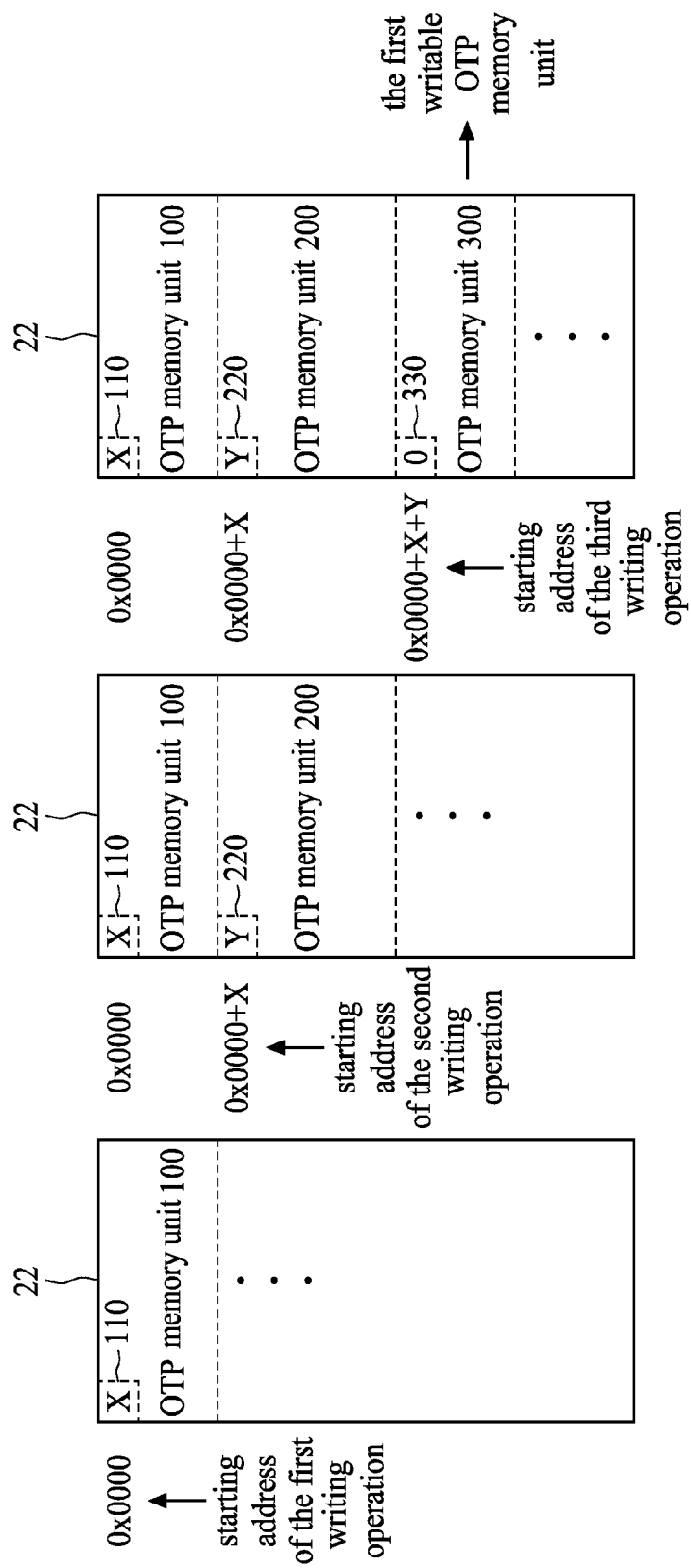
FIG. 5 is a diagram showing a method of writing a programmable memory device according to one embodiment of the present invention.

An embodiment of the present invention is described as follows in order to demonstrate the operation of a programmable memory device 20. Referring to FIGS. 4 and 5 together, while writing to the programmable memory device 20, the address-assigning unit 242 provides a start address such as address 0x0000 at the beginning for the memory array 22. Next, the checking unit 244 checks whether the OTP memory unit, the OTP memory unit 100 in the present embodiment, corresponding to the address 0x0000 has been programmed. In one embodiment of the present invention, the checking unit 244 checks the information stored in the mark field 110 of the OTP memory unit 100 to determine whether the OTP memory unit 100 has been programmed. If the mark field 110 stores bit "0", it indicates that the OTP memory unit 100 has not been written with data. As a result, the address 0x0000 assigned to the OTP memory unit 100 is the first writable OTP memory unit. Referring to FIG. 5, in the present embodiment, the mark field 110 storing bit "X" indicates that the OTP memory unit 100 has been programmed and written with data having an X-bit length. Accordingly, the offset unit 246 may add the bit length, the X-bit length in the present embodiment, to the 0x0000 to obtain a new address, an address "0x0000+X."

Thereafter, the address-assigning unit 242 provides the new address, the address "0x0000+X" in the present embodiment, for the memory array 22. The checking unit 244 checks, according to the new address, the bit length of data, if any, stored in the corresponding OTP memory unit, the OTP memory unit 200 in the present embodiment. As shown in FIG. 5, the OTP memory unit 200 has been written with data having a Y-bit length. Consequently, the offset unit 246 adds the Y-bit length to the address "0x0000+X" to obtain another new address, address "0x0000+X+Y."

Next, the address-assigning unit 242 provides another new address, the address "0x0000+X+Y", for the memory array 22. The checking unit 244, according to the new address, checks the bit length of data, if any, written in the corresponding OTP memory unit, the OTP memory unit 300 in the present embodiment. As shown in FIG. 5, the mark field 330 of the OTP memory unit 300 stores bit "0", which indicates that the OTP memory unit 300 has not been written with data yet. Therefore, the OTP memory unit 300 corresponding to the address "0x0000+X+Y" is the first writable OTP memory unit or a start OTP memory unit.

Unlike prior art structures, the programmable memory device 20 of the embodiments of the present invention uses a mark field of an OTP memory unit for determination of whether the OTP memory unit is programmable or not. As a result, the programmable memory device 20 of the embodiments of the present invention does not need any additional record element to record the programmed OTP memory unit. In addition, when data is written to the programmable memory device 20, the memory space is allocated according to the bit length of the data to be written, and the bit length of the data is recorded in a mark field. Therefore, the new start address generated by the last written data can be known by checking the information stored in the mark field of the OTP memory unit. In other words, the memory space of the programmable memory device 20 of the embodiments of the present invention can be fully utilized.

Figure 6:
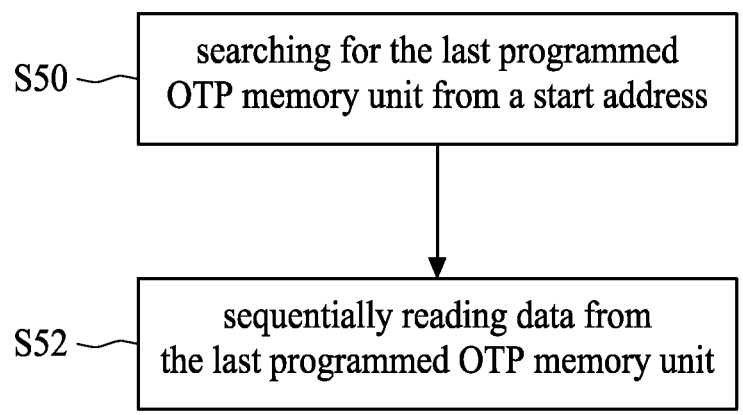
FIG. 6 is a flow diagram showing the steps of a method of reading a programmable memory device according to one embodiment of the present invention.

Alternatively, after the data Data-in is written into the OTP memory units of the memory array 22, a reading operation is carried out to read the written data. FIG. 6 is a flow diagram showing the steps of a method of reading a programmable memory device according to one embodiment of the present invention. After data is written according to the above steps, a reading method is performed. The reading method comprises the steps of: searching for the last programmed OTP memory unit from a start address (Step S50), and sequentially reading data from the last programmed OTP memory unit (Step S52). An embodiment of the present invention is described as follows in order to demonstrate the reading operation of a programmable memory device 20.

Figure 7:
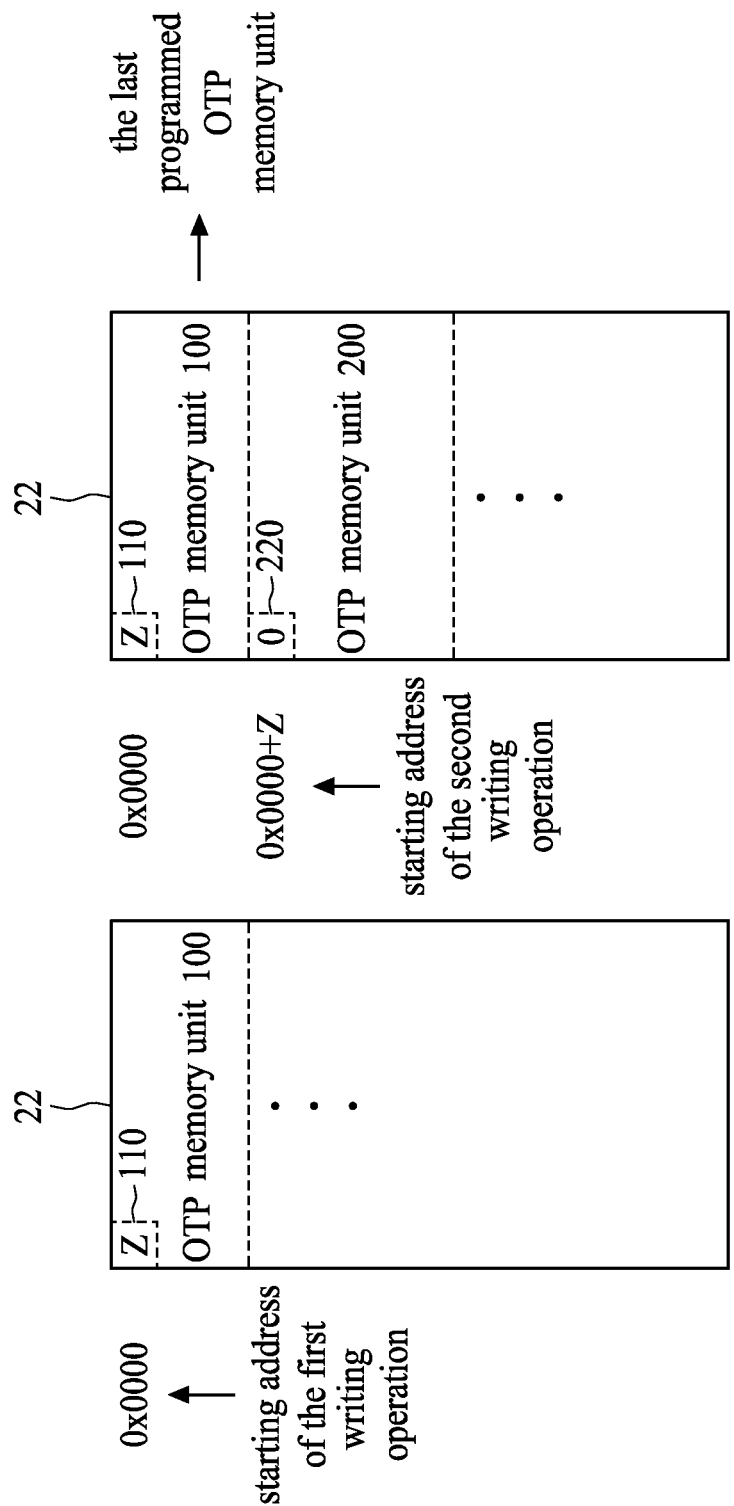
FIG. 7 is a diagram showing a method of reading a programmable memory device according to one embodiment of the present invention.

Referring to FIGS. 4 and 7 together, while reading from the programmable memory device 20, the search unit 24 will search for the last programmed OTP memory unit for preparation of reading data. During reading, the address-assigning unit 242 provides a start address, for example address 0x0000, for the memory array 22. Next, the checking unit 244 check the bit length of data, if any, written in the OTP memory unit (the OTP memory unit 100 in the present embodiment) corresponding to the address 0x0000. In the present embodiment, the checking unit 244 checks the data stored in the mark field 110 of the OTP memory unit 100. If the mark field 110 stores bit "0", it indicates that no OTP memory unit of the memory array 22 has been written with data, and the reading operation is terminated.

In the present embodiment, the mark field 110 stores bit "Z", which indicates that the OTP memory unit 100 has been programmed and written with data having Z bits of length. The offset unit 246 adds the Z-bit length to the address 0x0000 to obtain an updated address, the address "0x0000+Z." Thereafter, the address-assigning unit 242 may provide the address "0x0000+Z" for the memory array 22. The checking unit 244 then checks the bit length of data, if any, written in the OTP memory unit (the OTP memory unit 200 in the present embodiment) corresponding to the address "0x0000+Z." If the bit length of data written in the OTP memory unit 200 is zero, the OTP memory unit corresponding to the address (i.e. the address 0x0000) prior to the address "0x0000+Z" is the last programmed OTP memory unit.

Alternatively, if the bit length of data written in the OTP memory unit corresponding to the address "0x0000+Z" is greater than zero, the offset unit 246 adds the bit length to the address "0x0000+Z" to obtain another updated address. Next, the above steps are repeated until the last programmed OTP memory unit is determined from the plurality of OTP memory units according to a prior address of another updated address. Finally, the reading unit 28 sequentially reads data from the last programmed OTP memory unit.

According to some embodiments of the present invention, the unit can be realized as hardware, software, or firmware. In addition, the unit can be realized as a computer-programming product or a computer usable or readable medium, which provides program codes that can be executed by a connected computer or a program-executable operating system. The computer usable or readable medium can be any device that contains, stores, communicates, propagates, or transmits programs through the connected computer or the program-executable operating system, It will be apparent to those skilled in the art that various modifications and variations can be made to the disclosed embodiments. It is intended that the specification and examples be considered as exemplary only, with a true scope of the disclosure being indicated by the following claims and their equivalent.

What is claimed is:

1. A method of assessing a programmable memory device comprising a plurality of one-time programmable (OTP) memory units each assigned an address, the method comprising the steps of:

searching for a first writable OTP memory unit from a start address;
   reading a remaining bit length of the programmable memory device;
   comparing the remaining bit length to the data bit length of the data to be written; and
   performing, from the first writable OTP memory unit, writing steps comprising: writing a data bit length of data to be written and writing the data to be written if the remaining bit length is greater than the data bit length of the data to be written.

2. The method of claim 1, wherein the step of performing, from the first writable OTP memory unit, the writing steps comprises the steps of:

checking a bit length of data written in a corresponding one of the OTP memory units from the start address; and
   selecting, according to a result of checking, and writing the data to be written to the first writable OTP memory unit adjacent to written OTP memory units or from a start OTP memory unit.

3. The method of claim 2, wherein the step of checking comprises the steps of:

(a1) reading the bit length of data written in the OTP memory unit being assigned the start address, wherein the bit length is greater than zero;
   (a2) adding the bit length to the start address to obtain a next address;
   (a3) using the next address as a new start address and repeating the steps (a1) and (a2) until a bit length of data written in an OTP memory unit corresponding to a last new address is zero; and
   assigning the OTP memory unit corresponding to the last new address in step (a3) as the first writable OTP memory unit.

4. The method of claim 2, wherein the step of checking comprises the steps of:
reading a bit length of data written in the OTP memory unit being assigned the start address, wherein the bit length is zero; and
assigning the OTP memory unit corresponding to the start address as the first writable OTP memory unit.

5. The method of claim 1, wherein each OTP memory unit comprises a one-bit data storing region.

6. A method of reading a programmable memory device comprising a plurality of one-time programmable (OTP) memory units each assigned an address, the programmable memory device configured to be written with data according to the method of claim 1, the method comprising the steps of:
searching for a last programmed OTP memory unit from a start address; and
sequentially reading data from the last programmed OTP memory unit.

7. The method of claim 6, wherein the step of searching comprises the steps of:
checking a bit length of the data written in a corresponding one of the OTP memory units from the start address; and
selecting, according to a result of checking, and sequentially reading data from the last programmed OTP memory unit.

8. The method of claim 7, wherein the step of checking comprises the steps of:
reading the bit length of the data written in the OTP memory unit being assigned the start address, wherein the bit length is greater than zero;
adding the bit length to the start address to obtain a next address;
using the next address as a new start address and repeating the above steps until a bit length of the data written in an OTP memory unit corresponding to a last new address is zero; and
assigning the OTP memory unit corresponding to an address prior to the last new address as the last programmed OTP memory unit.

9. The method of claim 7, wherein each OTP memory unit comprises a one-bit data storing region.

10. A programmable memory device comprising:
a plurality of one-time programmable (OTP) memory units each assigned an address;
a search unit configured to search for a first writable OTP memory unit from the plurality of OTP memory units in a writing operation, or to search for a last programmed OTP memory unit from the plurality of OTP memory units in a reading operation;
a writing unit configured to write data to be written and a bit length of the data to the first writable OTP memory unit; and
a reading unit configured to sequentially read data from the last programmed OTP memory unit.

11. The programmable memory device of claim 10, wherein each OTP memory unit comprises a one-bit data storing region.

12. The programmable memory device of claim 10, further comprising a check unit configured to calculate the remaining bit length of the programmable memory device.

13. The programmable memory device of claim 10, wherein the search unit comprises:
an address-assigning unit configured to provide a start address, or an updated address for the memory array;
a checking unit configured to check a bit length of data written in the OTP memory unit corresponding to the start address or the updated address; and
an offset unit configured to provide the address-assigning unit with the updated address according to a result of a checking operation by the checking unit.

14. The programmable memory device of claim 13, wherein during a writing operation, if the bit length of the data written in the OTP memory unit corresponding to the start address or the updated address is zero, the OTP memory unit corresponding to the start address or the updated address is configured as a first writable OTP memory unit.

15. The programmable memory device of claim 13, wherein during a writing operation, if the bit length of the data written in the OTP memory unit corresponding to the start address is greater than zero, the offset unit adds the bit length to the start address.

16. The programmable memory device of claim 13, wherein during a reading operation, if the bit length of the data written in the OTP memory unit corresponding to the start address or the updated address is zero, the OTP memory unit corresponding to an address prior to the start address or the updated address is configured as a last programmed OTP memory unit.

* * * * *